United States Patent
Sabatini

[19]

[11] Patent Number: 6,133,864

[45] Date of Patent: Oct. 17, 2000

[54] ANALOG-TO-DIGITAL CONVERTER FOR PROCESSING ANALOG SIGNALS FROM A LARGE ARRAY OF DETECTORS

[75] Inventor: Marco Sabatini, Berkeley, Calif.

[73] Assignee: STMicroelectronics, Inc., Carrollton, Tex.

[21] Appl. No.: 09/053,552

[22] Filed: Apr. 1, 1998

[51] Int. Cl.[7] ................................................. H03M 1/00
[52] U.S. Cl. ........................ 341/141; 341/156; 341/159; 341/161
[58] Field of Search ................................. 341/141, 156, 341/159, 161

[56] References Cited

U.S. PATENT DOCUMENTS

| | | | |
|---|---|---|---|
| 3,820,112 | 6/1974 | Roth | 340/347 |
| 5,043,732 | 8/1991 | Robertson et al. | 341/156 |
| 5,099,239 | 3/1992 | Bruce et al. | 341/155 |
| 5,212,392 | 5/1993 | Berkcan et al. | 250/561 |
| 5,627,536 | 5/1997 | Ramirez | 341/141 |
| 5,696,510 | 12/1997 | Paillardet et al. | 341/156 |
| 5,821,893 | 10/1998 | Kumamoto et al. | 341/161 |

OTHER PUBLICATIONS

Thomas Byunghak Cho, "A 10 b, 20 Msample/s, 35 mW Pipeline A/D Converter," Mar. 1995, *IEEE*.

Yuh–Min Lin, A 13–b 2.5–Mhz Self–Calibrated Pipelined A/D Converter in 3–82 m CMOS, Apr. 1991, *IEEE*.

*Primary Examiner*—Brian Young
*Assistant Examiner*—Jason L W Kost
*Attorney, Agent, or Firm*—Theodore E. Galanthay; Lisa K. Jorgenson; Jeffrey K. Weaver

[57] ABSTRACT

A parallel pipelined analog-to-digital converter for use with chips containing large arrays of detectors is described. In these A/D converters, the degree of parallelism decreases between earlier and later pipeline stages. That is, there are fewer instances of at least one of the later stages than there are instances of at least one of the earlier stages. Thus, the instances of the earlier stages are responsible for processing a fewer number of pixels than are instances of the later stages. Viewed another way, the parallel pipelined analog-to-digital converter architecture of this invention assumes a tree or branched arrangement in which the earlier stages correspond to leaves and the later stage condense to branches. In an extreme example, the later stages coalesce to a single route.

23 Claims, 7 Drawing Sheets

ANALOG-TO-DIGITAL CONVERTER FOR PROCESSING ANALOG SIGNALS FROM A LARGE ARRAY OF DETECTORS

BACKGROUND OF THE INVENTION

The present invention relates to analog-to-digital converters for large detector arrays. More specifically, the invention relates to parallel "pipeline" analog-to-digital converters which have varying degrees of parallelism throughout the stages of the pipeline.

Many analog-to-digital converter designs are known in the art. They have different characteristics that make them suitable for a variety of applications. "ΣΔ" (Sigma Delta) analog digital converters can be made to have high precision (in the range of 16–20 bits), but are typically rather slow. "Flash" type analog-to-digital converters are much faster but having much lower precision, typically in the neighborhood of 6 bits. Various other analog-to-digital converter designs are in commercial use. On balance, the criteria that drive selection of a particular analog-to-digital converter are power consumption, precision, and speed.

One type of analog-to-digital converter is a pipelined converter. A pipelined analog-to-digital converter digitizes an analog signal in increments over multiple stages. The first stage digitizes the most significant bit or bits and then passes the undigitized residue to the second stage. That stage then digitizes the next most significant bit or bits, generates its own residue and passes it to the next successive stage (if any exist). While the second stage is digitizing its portion of the analog signal, the first stage begins digitizing the next analog signal in succession. In this manner, the pipelined analog-to-digital converter digitizes multiple analog signals, each in segments, starting with the most significant segment of the signal and proceeding through the pipeline stages until the least significant bit (or bits) is digitized by the last stage. The general goal of pipelined conversion is to provide a high throughput while adding latency.

FIG. 1 illustrates a conventional pipelined analog-to-digital design used in some commercial products. As shown, a pipelined analog-to-digital converter includes multiple stages (M different stages in this example). An analog signal 12 (Vin) is provided to a first stage 14 which quantizes a portion of analog signal 12 B bits in length. As mentioned, the most significant bits of analog signal 12 are quantized (digitized) by first stage 14. Stage 14 then outputs the unquantized least significant portion of the analog signal to the next successive stage. That stage then quantizes the next most significant B bits of the signal and outputs the residue to the next successive stage (if any). Eventually, the residue of a nearly completely quantized analog signal reaches the next to last stage 16 where the next to least significant B bits are quantized. Stage 16 then outputs the final unquantized residue of the analog signal to a final stage 18 which quantizes the least significant B bits of the signal. At this point, the entire analog signal 12 has been digitized in M separate B bit segments. Each of these B bit segments of digitized signal are assembled to provided the final digitized value of analog input signal 12.

It should be understood that there is no requirement that each of the M stages in pipelined converter 10 quantizes exactly B bits. Some stages may quantize more bits than others. In the lower portion of FIG. 1, an exemplary design for first stage 14 is illustrated. As shown, the input to stage 14 is unconverted analog signal 12 and the output from stage 14 is a residue 15 of analog signal 12 which does not include the most significant bits of the digitized signal.

Within stage 14, a sample and hold amplifier 20 holds the input sample for a defined period of time to allow subsequent comparison. The analog signal output the amplifier 20 is provided to both a coarse analog-to-digital converter 22 and to an adder 24. Analog-to-digital converter 22 then digitizes the most significant B bits of the analog signal provided by amplifier 20. In one specific example, analog-to-digital converter 22 is a flash type analog-to-digital converter. Regardless of the actual design, A/D converter 22 should have a resolution of B bits. The B bits of digitized signal are then output as a digital signal 26. Digital signal 26 is also fed to a digital-to-analog converter 28 which precisely reconverts the most significant B bits back to an analog signal which is provided to adder 24 as a negative quantity. Thus, adder 24 subtracts the value of the most significant portion of analog signal 12 from the entire analog signal 12 (which was provided directly from amplifier 20). The result is a residue analog signal 32 which is provided to an interstage amplifier 34. Amplifier 34 multiplies residue signal 32 by 2 to the B power. This shifts the value of the analog residue ahead by B bits. Thus, the second most significant B bits are advanced to the magnitude of the most significant bits in analog residue signal 15. The shifted and amplified residue signal 15 is then handed off to the second stage where it undergoes a similar operation to digitize the second most significant B bits and output a residue lacking the 2*B most significant bits. Note that if digital error correction is implemented, amplifier 34 multiplies residue 32 by $2^{(B-1)}$, not $2^B$.

Various stages in the pipelined design have different demands and therefore need not be identically designed (see T. B. Cho and P. R. Gray, "A 10 b, 20 Msample/s, 35 mW Pipeline A/D Converter," IEEE Journal of Solid-State Circuits, Vol. 30, No. 3, (1995) which is incorporated herein by reference in its entirety and for all purposes). This is because with each successive stage, the analog output signal has to settle at a precision that scales with $2^{(B*d)}$—where d is the depth of the pipeline at the current stage—thereby relaxing the speed requirements for the later stages.

This invention relates to detector arrays including pipelined analog-to-digital converters (preferably on a single chip). When a pipeline design (like any other analog-to-digital converter design) is applied to a large array of detectors such as photodiodes in a CMOS imager, optimization requires fundamental tradeoffs between converter speed, pitch constraints, and power dissipation. At the one extreme, a single analog-to-digital converter could be provided for every pixel or every row of pixels. In such case, the converter can operate at a relatively slow rate; at the frame rate of a video recorder or the frame rate times a multiplier given by the number of pixels in a row. Often though pitch constraints make this solution unattractive; e.g., for a CMOS photosensor, the pitch is usually in the 4 to 10 micrometer range. Further, power dissipation scales linearly with the number of pixels, so numerous analog-to-digital converters collectively dissipate significant power around the chip's periphery. Still further, such designs can suffer from line routing difficulties, crosstalk, fixed pattern noise, and other problems associated with transmitting many signals to many separate analog-to-digital converters.

At the other extreme, a single analog-to-digital converter could be employed to digitize the outputs of all the pixels on the imager array. This architecture has the advantage of occupying less area on the chip's surface. However, it cannot be scaled up easily. It must operate very fast; at the frame rate times the total number of pixels on the imager. In the case of super VGA, with one million pixels for example, this means that the converter must operate at 30 MHz. Digital cameras have even more pixels and must operate even faster. Converters operating at these speeds can be difficult to design. Also, they can dissipate very large amounts of power concentrated at one location on the chip. This sets up large temperature gradients which can very detrimentally affect the quality of any image generated by the detector array. Another difficulty of designs employing only one or a few analog-to-digital converters is the requirement that an analog multiplexer be placed before the analog-to-digital converter. This multiplexer may introduce some errors into the analog signal presented to the converter.

Various intermediate solutions are available in which the number of separate analog-to-digital converters, the speed of the converters, the precisions of the converters, and the concentration of power dissipation are traded off. However, these tradeoffs become very severe when the number of input analog signals becomes large (in the case of digital camera detector for example). It is clear from this and the above discussion that improved analog digital converter architectures and associated integrated circuit designs would be welcome.

SUMMARY OF THE INVENTION

The present invention provides parallel pipelined analog-to-digital converters in which a degree of parallelism decreases between earlier stages and later stages of the pipeline chain. That is, there are fewer instances of at least one of the later stages than there are instances of at least one of the earlier stages. Thus, the instances of the earlier stages are responsible for processing a fewer number of analog inputs (e.g., pixel outputs) than are instances of the later stages.

The present invention breaks the tradeoff between number of analog channels to be processed and the number of full pipeline analog-to-digital converters used. In the architectures so far implemented, some number, M, of analog channels are processed by a single pipeline analog-to-digital converter. M could range anywhere from 1 to the total number of channels, going from fully parallel to a single pipeline analog-to-digital converter architecture. In the present invention, the degree of parallelism is applied to the single stages of the pipeline analog-to-digitial converter instead of the whole pipeline analog-to-digital converter. Instead of sharing analog channels, the present invention shares residues at different degrees of parallelism along the pipeline stages chain.

Viewed another way, the parallel pipelined analog-to-digital converter architecture of this invention assumes a "tree" or branched arrangement in which the earlier stages correspond to leaves and the later stage condense to large branches. In an extreme example, the later stages coalesce to a single route.

This invention takes advantage of the fact that the hardware in the later stages of the pipeline has less stringent speed requirements than does the hardware in the earlier stages. Thus, instances of the earlier stages process signals from relatively few sources, while instances of the later stages (which can handle more signals in the available time) can process signals from a relatively large number of sources. This design does not require that analog multiplexers be placed before the first stage. Instead the multiplexers are moved downstream, thereby improving the immunity to multiplexer error and noise, since the downstream residues tolerate a higher noise level than do the input signals.

In one aspect, the present invention provides an analog-to-digital converter which may be characterized as including a plurality of "sections" (sometimes referred to herein as stages) connected in a pipeline arrangement such that an "earlier section" receives analog signals and a "later section" (which is located downstream from the earlier section) receives analog residues of the analog signals after the earlier section has partially digitized the analog signals. In this pipeline arrangement, the earlier section includes a first number of instances of an earlier stage and the later section includes a second number of instances of a later stage, which second number is smaller than the first number. Each instance of the earlier stage receives one or more separate analog signals, while at least one instance of the later stage receives analog residues originating from multiple instances of the earlier stage. This design may be implemented by providing one or more analog multiplexers between the first and second sections. The hardware of each instance of a given stage may be of any suitable design such as the design described in the background above.

Obviously, the analog-to-digital converter may include more sections than just the mentioned earlier and later sections. In general, M number of separate sections may be connected in pipelined arrangement. Together the stage instances in the pipelined sections define a tree architecture.

A preferred application of the analog-to-digital converters of this invention is in the context of an imager such as a CMOS imager used in digital cameras or video equipment. Devices for such applications may include an array of detectors which provide analog output signals indicative of physical stimuli to which the detectors have been exposed (in addition to an analog-to-digital converter of this invention). Separate analog signals from the individual pixels of the array are provided to lines which carry the pixel outputs to a first section of the analog-to-digital converter. In the certain preferred embodiments, such as CMOS imager embodiments, the detector array and the analog-to-digital converter are provided on a single semiconductor substrate. In the case of CMOS imager, the individual detectors may be photodiodes.

Another aspect of the invention provides a system for producing an image of an object. This system includes an imager of the type described above and one or more components for directing an optical image onto the pixels. It may also include a mechanism for outputting an image resulting from the outputs of the one or more pixels. The image may be output as a photograph or in a computer display device in the case of a digital camera for example.

Yet another aspect of the invention provides a method of digitizing analog signals from a plurality of sources. The method may be characterized by the following sequence: (a) partially digitizing a plurality of separate analog signals at an early stage of a pipelined analog-to-digital converter; (b) multiplexing a plurality of residues of the separate analog signals output from the early stage such that said plurality of residues is provided to a later-stage of the pipelined analog-to-digital converter; and (c) further digitizing the multiplexed residues at the later stage. Preferably, the early stage digitizes the most significant bit or bits of the separate analog signals and the later stage digitizes the most significant bit or bits of the residues received from the early stage. Of course, an even earlier or even later stage and any additional stages may be employed, if necessary, to completely digitize the plurality of separate analog signals. The analog residues output by the later stage may be multiplexed before being fed to the next successive stage.

These and other features and advantages of the present invention will be described in more detail below with reference to the appended drawings.

DETAILED DESCRIPTION OF THE PREFERRED EMBODIMENTS

The present invention provides pipelined analog-to-digital converter architectures which accurately and rapidly digitize analog outputs for arrays of detectors such as CMOS photodiode arrays. The invention accomplishes this by employing a "tree" architecture in which the converter employs more instances of earlier stages than of later stages in the pipeline. In the following description, various specific details are set forth in order to fully illustrate preferred embodiments for accomplishing the analysis of this invention. For example, certain specific applications of the invention (e.g., providing the architecture on a CMOS photodiode array chip) will be described. It should be understood, however, that the invention may be practiced without limitation to the specified details and applications presented herein.

Figure 1:
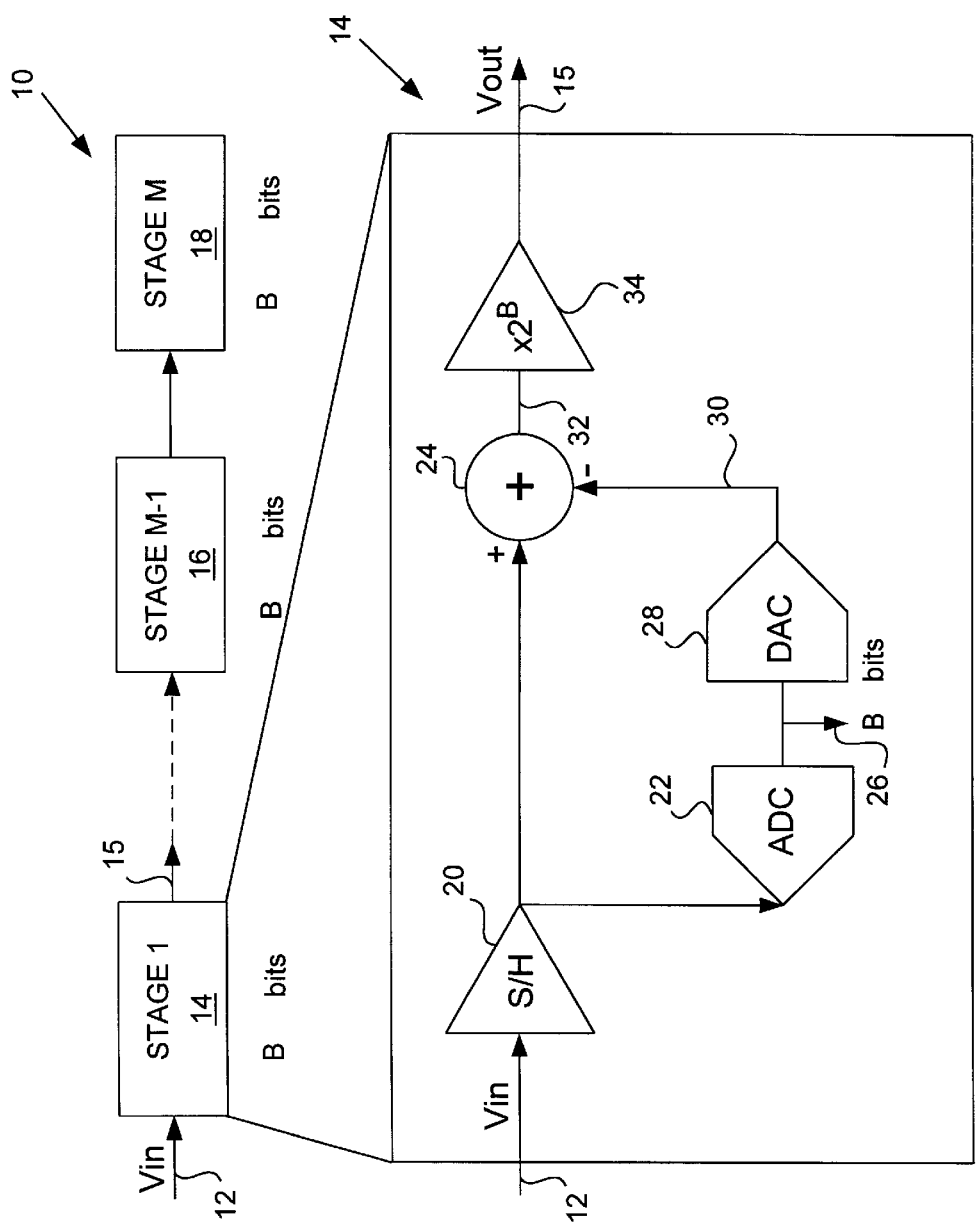
FIG. 1 is a schematic illustration of an analog-to-digital converter having a pipelined architecture and of the blocks employed within a given stage of the pipeline.

The time constant required for the interstage amplifier 34 and the adder 24 (see FIG. 1), and that together determine the speed of the stage, relaxes from the earlier stages to the later stages of the pipeline. This can be understood by considering the mathematical approximation for an interstage amplifier's time constant $\tau$ (assuming a single pole amplifier and assumming that it is not slew rate limited):

$$\tau < Tsettle/[(N-B*d)\ln 2]$$

Tsettle is the settling time requirement for the pipeline stage components under consideration. In the stage design depicted in FIG. 1, these components are adder 24 and multiplier 34. The settling time represents the time required to process one datum from all the channels handled by the stage instance. It is generally one-half the sampling frequency.

Obviously, as a stage handles more channels (pixels), the allowed settling time decreases (i.e., the hardware must operate faster). N is the total resolution of the digital signal after it has passed through all stages of the pipeline. If the pipeline includes four stages and each has a resolution of three bits, the total resolution, N, is twelve bits. B*d is the total number of bits that have been digitized from the first stage of the pipeline to the current stage. In the four stage example, the value of B*d is three bits after the first stage, six bits after the second stage, and nine bits after the third stage. Thus, N–B*d is the resolution at which the next successive stage has to settle. The value of N–B*d is twelve bits at the first stage, nine bits at the second stage, six bits at the third stage, and three bits at the fourth stage. Thus, the value of $\tau$ can be around four times greater in the last stage than in the first stage—assuming that all the stages process the same number of channels.

Generally, the above expression indicates that as the value of B*d increases with successive stages in the pipeline, the constraint on $\tau$ relaxes. Thus, with each successive downstream stage, the stage hardware may have a higher value of $\tau$. This allows various points of design optimization. First, since the hardware speed constraint is reduced for later stages, the later stages can be designed to consume less power than the earlier stages. Further, later stages can tolerate more noise due to decreasing stage resolution.

Another approach uses the same or similar hardware designs in upstream and downstream stages. In this case, a hardware designer can extract more computation from later stages than from earlier stages because the downstream stages can handle a greater data rate than the upstream stages. For example, if the time constant required for a given downstream interstage amplifier to process the data from one channel is significantly greater than that amplifier's actual time constant, then that stage may be employed to process data from multiple channels. This also relaxes the pitch constraints since more analog residues are processed by the same stage. This recognition allows the designs in the present invention.

Figure 2A:
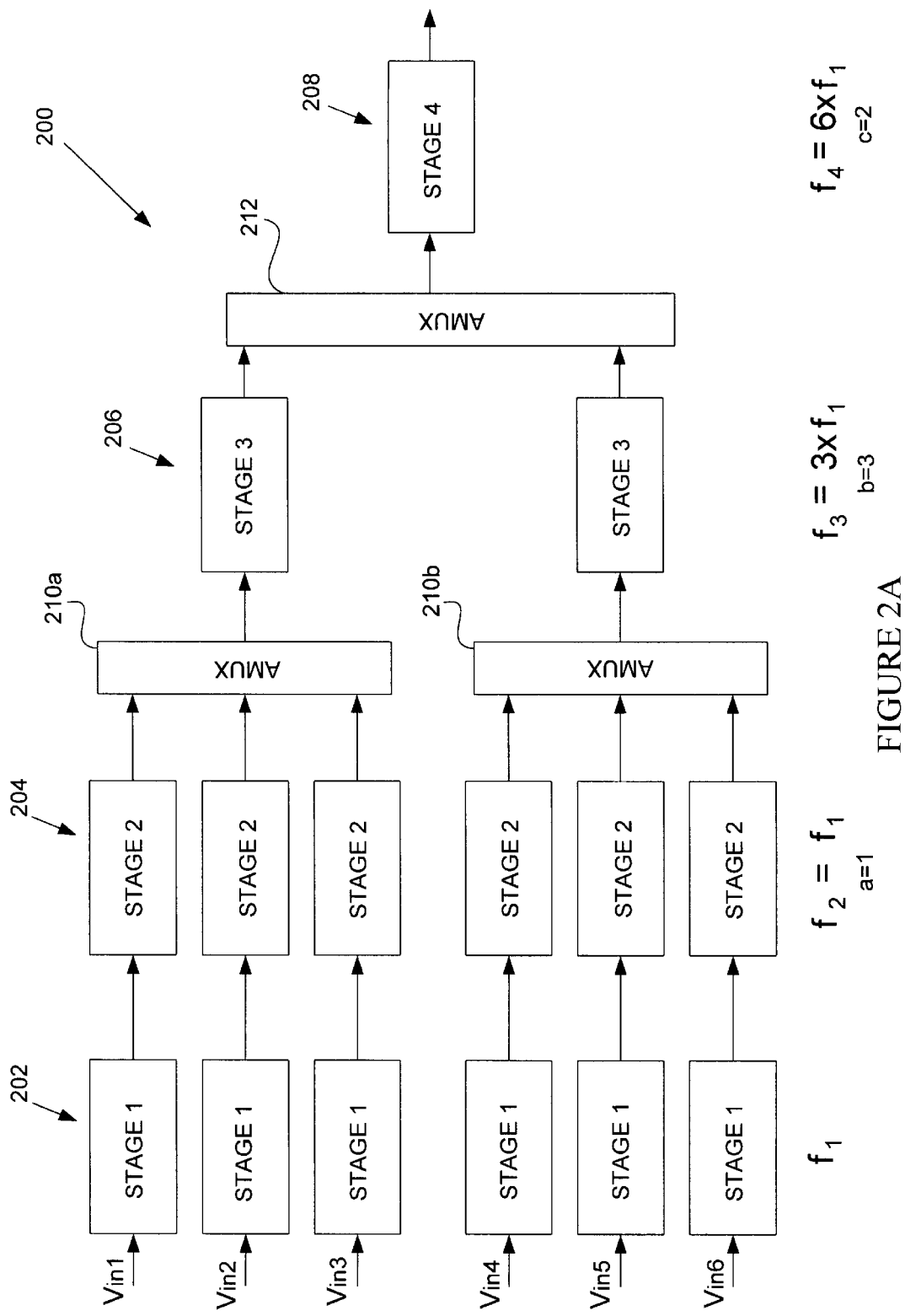
FIG. 2A is a block diagram of a first exemplary architecture for implementing the graded parallelism pipelined design of this invention.

The present invention exploits the relaxation in time constant requirements in an optimized pipeline stage design with a different degree of parallelism along the pipeline chain. A preferred example of the architecture is illustrated in FIG. 2A. The structure shown in this Figure may represent an entire analog-to-digital converter, but more likely represents a portion of a much larger converter. In the Figure, six analog channels, denoted by voltages Vin 1 through Vin 6, are provided. Each channel may provide the analog output of a detector or row of detectors, for example. In a typical detector array, very many more channels will be employed; hundreds or thousands of channels are common. As shown in FIG. 2A, an analog-to-digital converter or converter section 200 includes four sections or stages: a first section 202, a second section 204, a third section 206, and a fourth section 208. In one example, converter portion 200 may output a 12 bit digital value in which each of the four sections quantizes three bits of an input analog signal Vin.

In this example, the first two sections (stages 202 and 204) are fully parallel; that is the number of instances of the sections is equal to the number of channels. Because the time constant for the interstage amplifier and in second stage 204 can be relaxed, the stage design for level 204 can be optimized in power.

The outputs from the instances of stage 204 are provided to two separate analog multiplexers 210a and 210b which control the analog inputs to the two instances of third stage 206. Each instance of third stage 206 must process three channels for every one channel processed by the instances of first stage 202 and second stage 204. This is because each instance of stage 206 must process three times as many inputs as must the instances of stages 202 and 204 in a given time dictated by the requirements of the system (e.g., a frame rate). Of course, the interstage amplifiers employed in the instances of third stage 206 need not have time constants which are ⅓ that of the interstage amplifiers in first stage 202 (i.e., instances of stage 206 need not be three times faster than instances of stages 202 or 204—see the above expression for τ). Thus, the instances of third stage 206 can be optimized to meet pitch constraints and minimize power consumption.

In converter portion 200, the outputs of third stage 206 are provided to a two input analog multiplexer 212 which outputs multiplexed analog signals to the single instance of fourth stage 208. The instance of stage 208 must process six times as many channels as the instances of first stage 202. Again, however, because of the greatly relaxed restraints on the time constant and the pitch for the amplifier in stage 208, this stage can be optimized to handle the increased throughput.

Another advantage of this architecture (over the architecture that uses analog channels multiplexed to a single analog-to-digital converter) is that the analog multiplexers used need not be precise to the full digital resolution when used to multiplex residues. This is because precision requirements for analog multiplexers relax when the multiplexers are placed among later stages down the pipeline chain. Stated another way, the present invention provides a high degree of parallelism in earlier stages, where accuracy is most critical. Therefore, the present invention greatly improves on some prior designs in which one or more analog multiplexers were provided at the front end of the analog-to-digital converter, thereby possibly introducing errors to the analog signal. In the present invention, the analog multiplexing is less problematic because a significant fraction of it is performed downstream after the most significant bit or bits have already been digitized.

In the general architecture, there are the X stage instances shown in section 1, X/a stage instances of section 2, X/ab stage instances of section 3, and so on, where a, b . . . are numbers indicating the multiplexer factor at the second stage, third stage, and so on. In the example of FIG. 2A, a=1, b=3, and c=2.

Generally, in the converter architectures of this invention, the first section (and any other section having the same number of instances as the first section) has the most severe constraint on the time constant of the interstage amplifier. Further, the first stage must be the most accurate. Given these constraints, analog-to-digital converters of this invention generally require that each instance of the first stage handles the fewest number of input analog signals (in comparison to instances of other stages). Thus, the instances of the first stage (and instances of any other stage having the same number of instances as the first stage) have the most relaxed overall speed requirement. Instances of the second stage must process "a" times more channels than instances of the first stage, but are better able to handle this load because the required time constant is relaxed by a factor of N-B. The same relaxation in time constant applies to the other successive stages as indicated in the expression for r.

The converter architecture of the present invention allows for flexible adjustment in the number of stages, multiplexer factors (the values of a, b, c . . . ) and can be adapted to any precision, speed and power consumption required by the application at hand. The location of the multiplexers and arrangement of stages (sections) can be adjusted to optimize the relevant constraints at any given stage in the pipeline. The resolution of the signal to be digitized will often determine the total number of stages employed in the pipeline. When higher resolution is required, then more stages generally are needed.

As mentioned, high precision applications suggest that the analog multiplexers be provided at locations downstream where less significant bits are being converted. Also, in applications where high rates of data conversion are required, it may be desirable to maintain the greater degrees of parallelism in the early stages (i.e., keep the multiplexers downstream). However, when pitch constraints are severe as in large arrays, it may be desirable to move the multiplexers upstream to reduce the parallelism earlier in the pipeline. Also, this reduces the power consumption of the analog-to-digital converter.

Figure 2B:
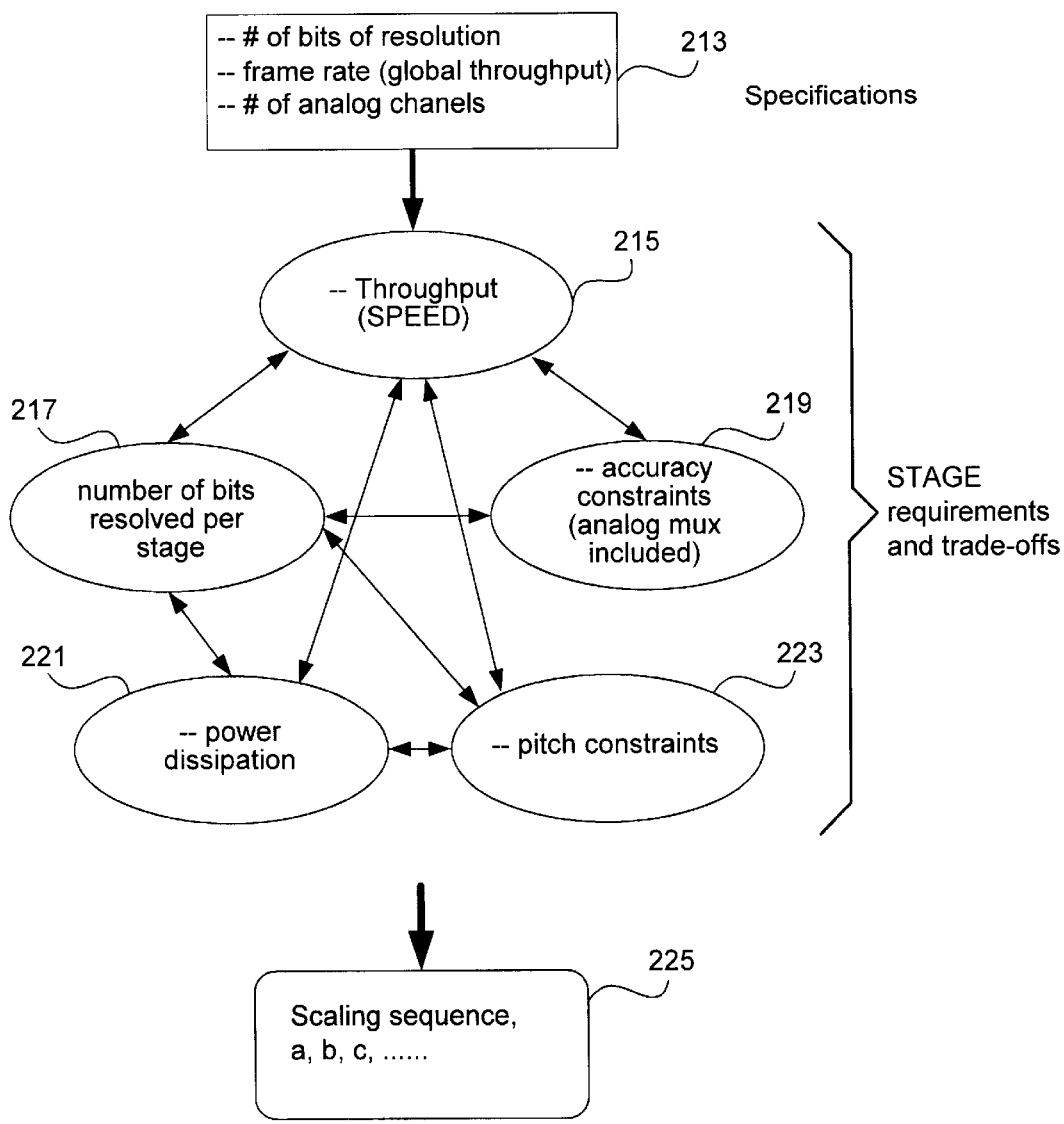
FIG. 2B is a depiction of the various parameters that can be optimized in a parallel pipelined design of the present invention.

The way the scaling sequence, S={a, b, c, . . . }, is chosen is a complex tradeoff between power, speed, pitch, accuracy, and number of bits resolved per stage, as illustrated in FIG. 2B. Any of these constraints can be represented by a cost function. As shown in the figure, an input specification 213 specifies such application requirements as the number of bits of resolution, the frame rate, and the number of analog channels. With these constraints in hand, an optimization algorithm will balance the various tradeoffs as cost functions. In the example shown, the cost functions include speed 215, number of bits resolved per stage 217, accuracy 219, power dissipation 221, and pitch constraints 223. An appropriate scaling sequence 225 for a given application results from a minimization of a global cost function given by a weighted sum of the individual cost functions.

Figure 2C:
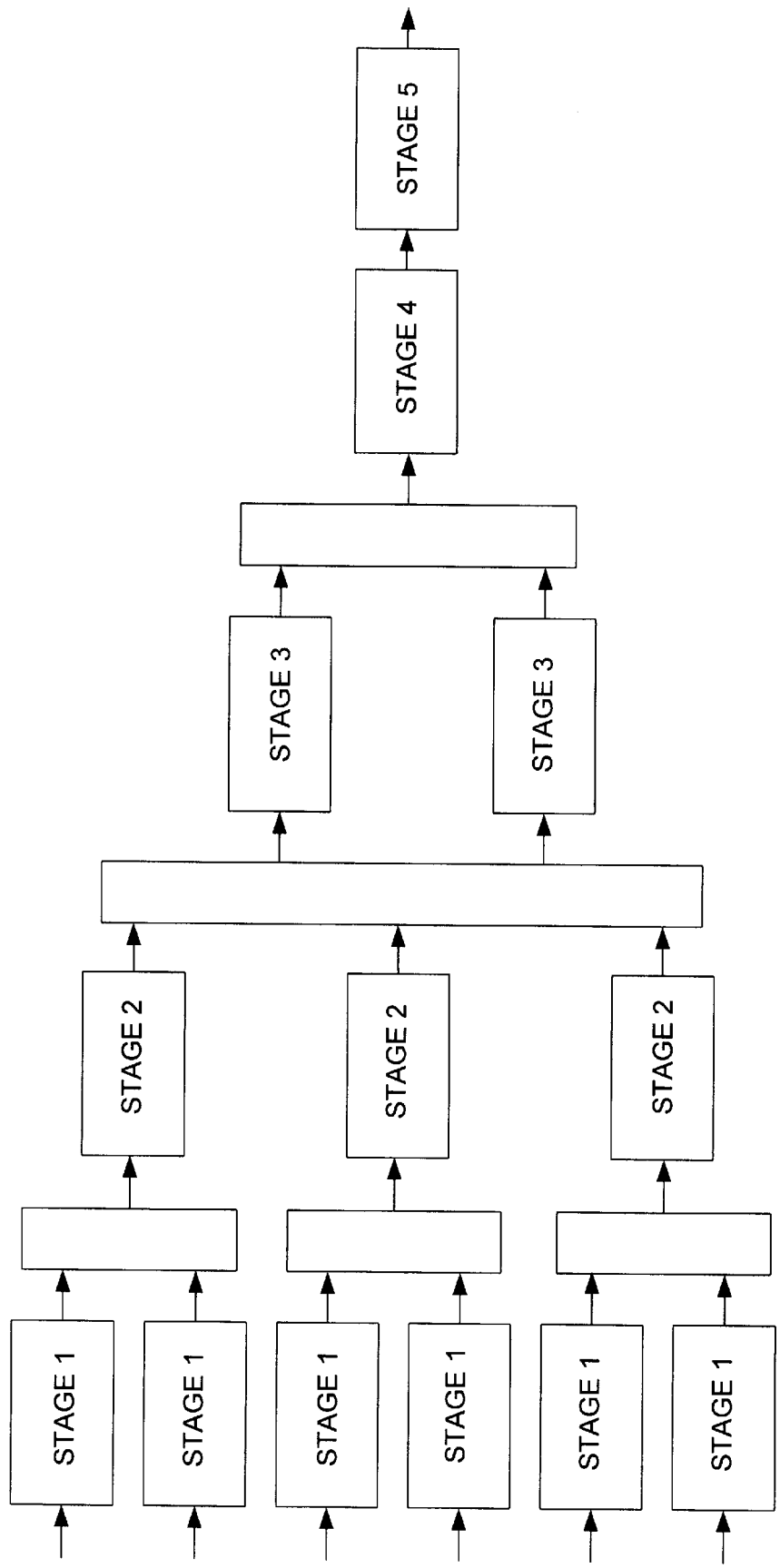
FIG. 2C is a block diagram of a second exemplary embodiment of the architecture of this invention.

FIG. 2C provides, for the sake of illustration, an alternative analog-to-digital converter architecture in accordance with this invention. In this design 220, five sections (stages) are employed: a first section 222, a second section 224, a third section 226, a fourth section 228, and a fifth section 230. For the sake of comparison, this embodiment is also shown with six analog input signals or channels. Thus, there are six instances of first stage 222. Between first stage 222 and second stage 224, three analog multiplexers (multiplexers 232a, 232b and 232c) reside to provide a multiplexer factor of 2. Thus, a=2.

Interposed between stages 224 and 226 is a three input, two output (two instances of third stage 226) multiplexer 234. Thus, the value of b is 3/2. Moving downstream to the next stage 228, a multiplexer 236 multiplexes the outputs of the two instances of stage 226 and provides them to the single instance of stage 228. Thus, the value of c is 2. The output of stage 228 is provided unmultiplexed to final stage 230. Thus, the value of d equals 1.

Each stage in the converter architecture has its own characteristic frequency at which it must operate. As illustrated in FIG. 2A, the first stage operates at a fundamental frequency $f_1$. Each successive stage must operate at some multiple of $f_1$ given by the mutliplexer factor of that particular stage. In a standard video application, the value of $f_1$ is given by the frame rate times the number of pixels per row or the pixel rate divided by the numbers of rows.

The architecture of this invention is not limited to that described above. Generally, any pipelined analog-to-digital converter in which the degree of parallelism decreases in moving from an earlier stage to a later stage may provide the benefits described herein.

Figure 3:
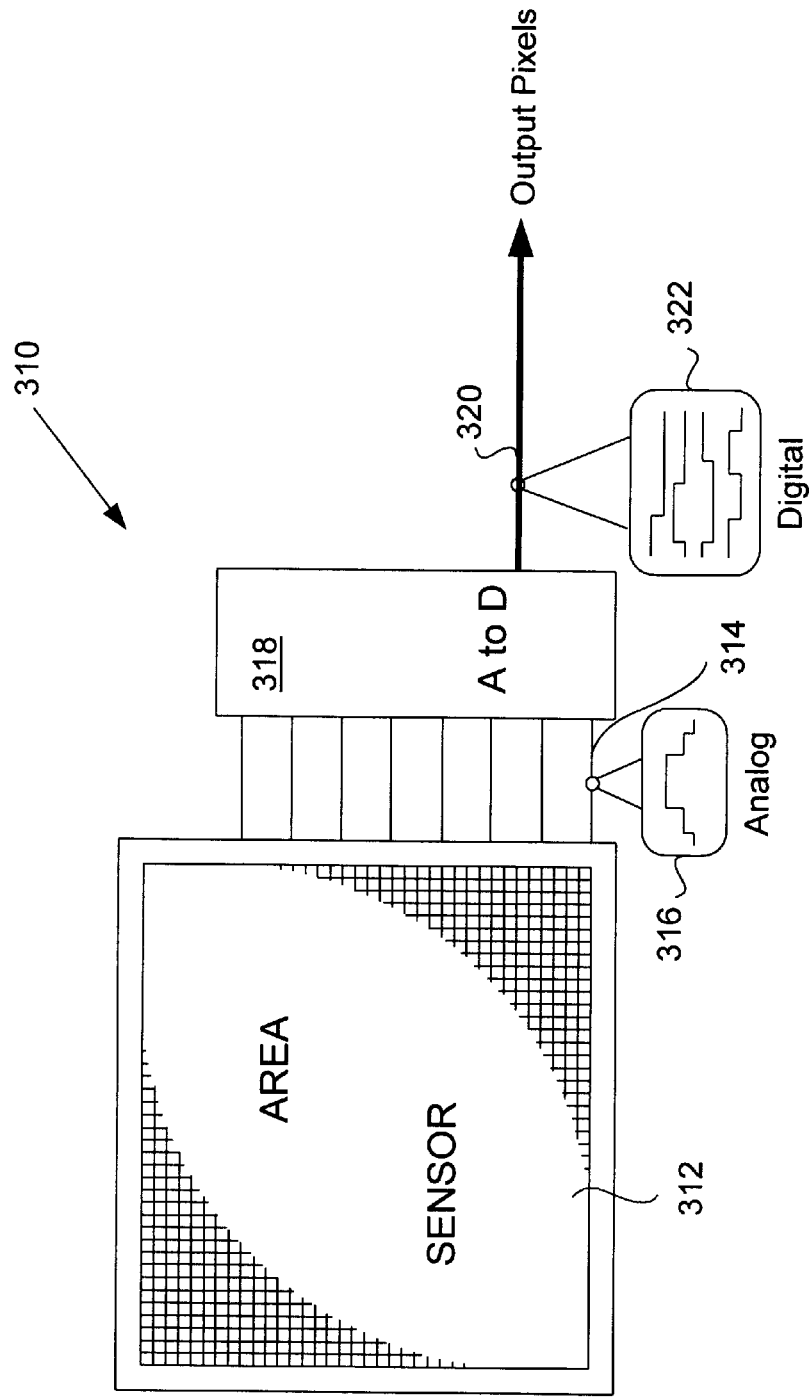
FIG. 3 is a block diagram illustrating high level functional blocks employed in a detector array implementing the analog-to-digital converter architecture of the present invention.

FIG. 3 presents one preferred system architecture for implementing a CMOS imager in accordance with this invention. Preferably, all elements of the depicted system are implemented on a single integrated circuit chip. The figure presents an imager 310 including two primary elements: a pixel array area sensor 312 and a pipelined analog-to-digital converter 318.

Area sensor 312 includes a plurality of regularly arranged pixels each capable of responding to radiation impinging on the sensor. Often, as in the case of most digital cameras, the radiation will be visible electromagnetic radiation. Detection of other types of radiation is within the purview of this invention. Each pixel produces an output indicative of the radiation intensity over time (integral of intensity with time) striking the pixel. In one specific embodiment, area sensor 312 includes an array of 2048 (vertical direction) by 2048 (horizontal direction) pixels, but of course the actual array dimensions will depend upon the application and the scale of the IC fabrication technology. In operation, an optical image may be directed onto area sensor 312 such that spatial and/or temporal variations in light intensity (or some other radiation feature such as wavelength) may be temporarily recorded by the individual pixels making up sensor 312.

The signals from the individual pixels of sensor 312 are output over one or more lines 314 as analog signals 316. These analog signals 316 are received by pipelined analog-to-digital converter 318 which converts them to digital signals 322 and outputs such digital signals over a line 320 to image display circuitry.

While the individual elements of system 310 may be implemented on different physical structures, area sensor 312 and analog-to-digital converter 318 are preferably provided on a single integrated circuit chip. One of the most significant benefits of CMOS-based image sensors is their easy integration with on-chip analog-to-digital converters and post processing circuitry. As mentioned, the analog-to-digital converters of this invention will consume little power and occupy little area, yet meet the pixel processing rate at the resolution required of the system's application.

Figure 4:
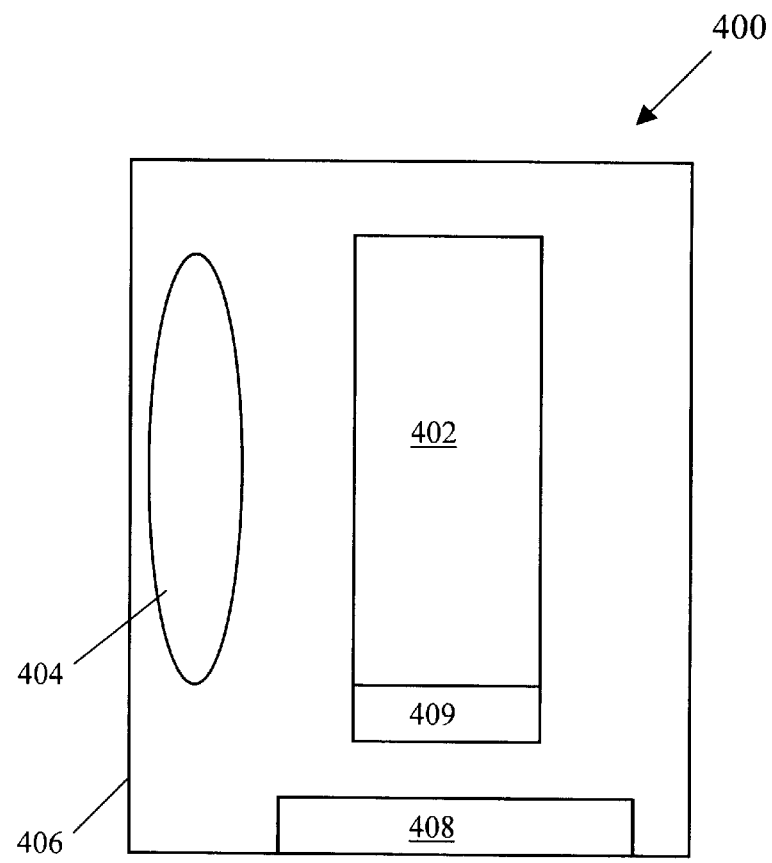
FIG. 4 is a block diagram of a system employing a detector such as that illustrated in FIG. 3.
Figure 4:
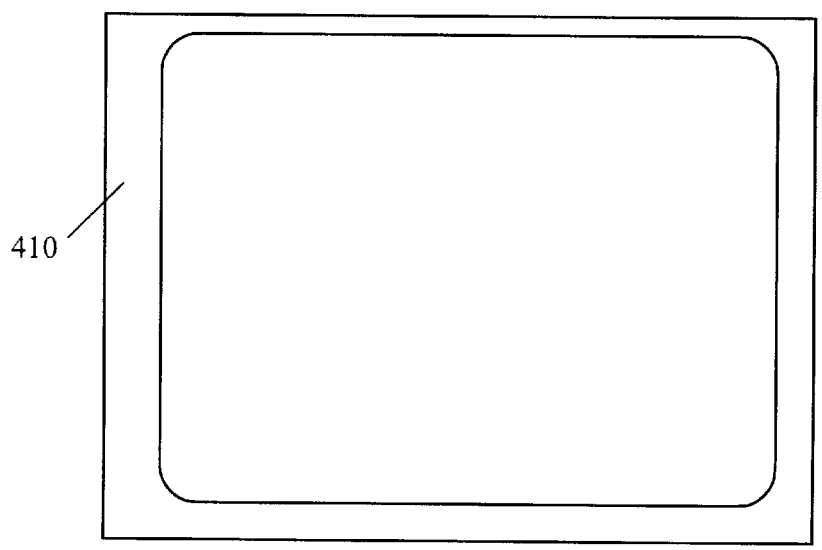

Detector arrays employing the parallel pipelined analog-to-digital converters of this invention may be deployed in various systems for military, scientific, business, and home applications. For example, they may be used in digital cameras, video recorders, night driving displays, etc. Generally, as illustrated in FIG. 4, a system 400 will include, in addition to a detector array 402, optics 404 to capture an image and direct it onto the array. This may include one or more lenses, filters, etc. of the types conventionally employed in image capture systems. The optics and detector array will be mounted in a casing 406 such as a camera case. The system will also include an output mechanism 408 for outputting the image(s) from an analog-to-digital converter 409 of this invention to a display system 410 such as a printer or computer system. Such computer system may include a computer display device such as an LCD screen, a plasma display, or a CRT display (together with associated printing and display electronics and/or software). The output mechanism may include appropriate data buses connectors and possibly cabling. Further, the system may include a memory for temporarily storing captured images for later downloading to the display system. In some instances, the display system itself will form part of the overall imager system. The ultimate output may take the form of an image on a display screen, a photograph, a printed page, a display on a window forming part of operating machinery such as an automobile, airplane, etc.

Figure 5:
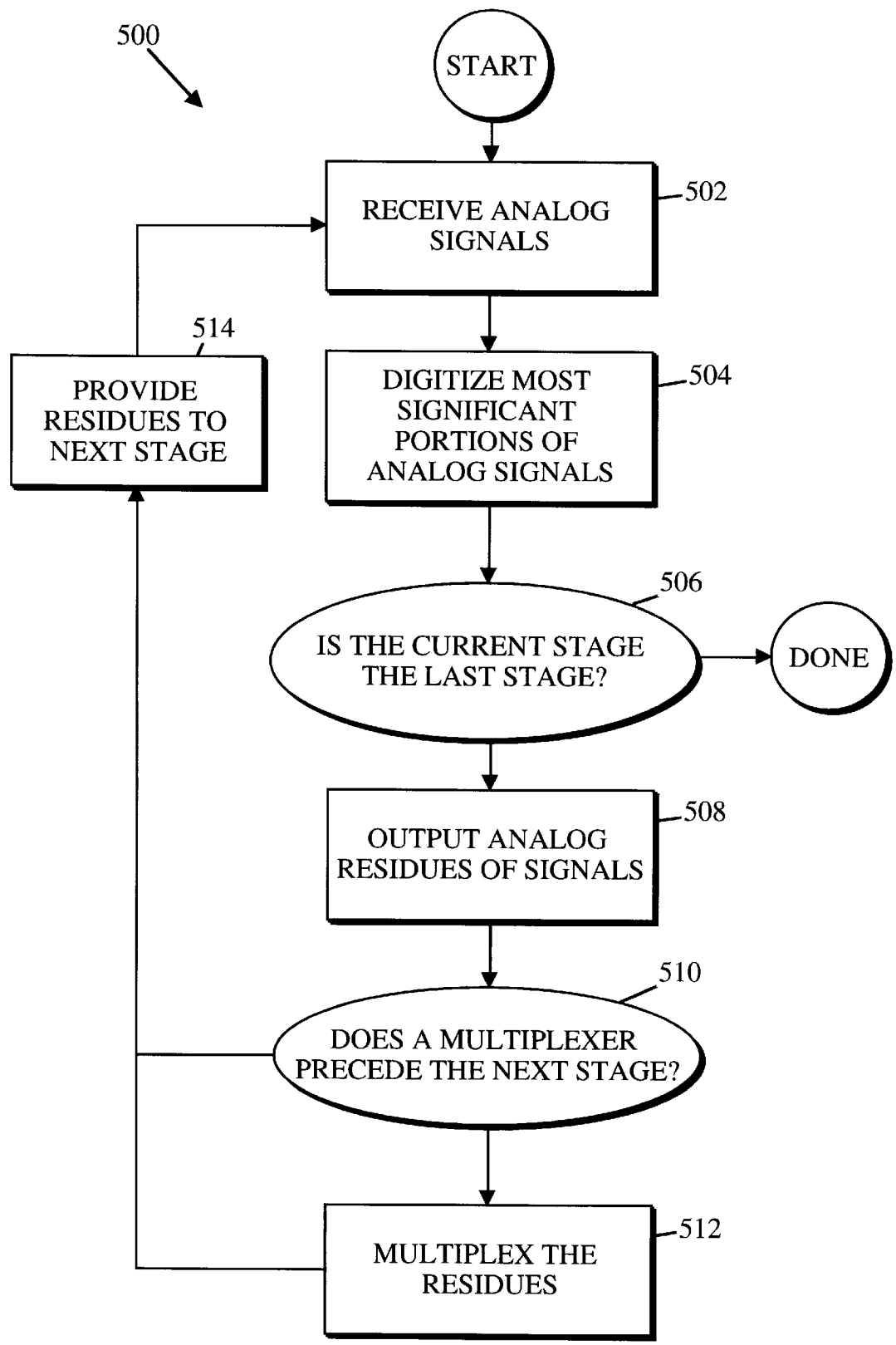
FIG. 5 is a process flow diagram depicting steps of digitizing analog signals in accordance with a preferred embodiment of this invention.

This invention may also be viewed as a method of digitizing analog signals. The analog signals are provided from multiple lines, so multiple analog-to-digital pathways are provided. As explained above and illustrated in the figures, this arrangement is common in sensor arrays having multiple pixels, each of which (or each row of which) provides analog output over a separate line. In a method 500 as illustrated in FIG. 5, the analog signals are first received by multiple instances of a stage at a step 502. At the first stage, the analog signals are received from the signal sources without any portion of the signal being digitized. After receipt of the analog signals, each instance of the stage digitizes the most significant bit or bits of its respective analog signal at a step 504. Thereafter the system determines—at decision step 506—whether the current stage (the one that just digitized a portion of the analog signals it received) is the last stage in the pipeline. Obviously, the first stage is not the last stage, so initially step 506 is answered in the negative.

Next, the instances of the stage output residues that are the undigitized least significant portion of the analog signals that the stage received (see step 508). Then the system determines—at a decision step 510—whether there is a multiplexer preceding the next stage in the pipeline. In the example of FIG. 2A no such multiplexer exists after the first stage, and in the example of FIG. 2C such a multiplexer exists after the first stage. Thus, in the embodiment of FIG. 2A, decision step 510 is answered in the negative after stage 1, and in the embodiment of FIG. 2C, decision step 510 is answered in the affirmative after stage 1. Assuming that there is a multiplexer after the current stage, output residues are multiplexed as appropriate at a step 512. The multiplexed residues are then provided to the next successive stage at a step 514. If there is no multiplexer after the current stage, the residues are directly provided to the next stage at step 514, without prior multiplexing.

The residues provided at step 514 are received by the instances of the next stage at step 502. Digitization of the next most significant portion of the input analog signals then proceeds as described above through steps 504, 506, 508, 510, 512 (assuming a multiplexer prior to the next stage), and 514. The process continues looping in this manner, until the analog signal is fully digitized. At some point after the first stage, the last stage is reached. At that point, decision step 506 will be answered in the affirmative and the digitizing process will conclude. The digitized output is then completely assembled for output and further processing by digital image processing circuitry.

Although the foregoing invention has beer, described in some detail for purposes of clarity of understanding, it will be apparent that certain changes and modifications may be practiced within the scope of the appended claims. For example, while the specification has described certain pixel and chip architectures which accomplish objectives of the present invention, many others which will be understood by those of skill in the art from the present disclosure to be within the spirit of the present invention may equally be used. Therefore, the present embodiments are to be considered as illustrative and not restrictive, and the invention is not to be limited to the details given herein, but may be modified within the scope of the appended claims.

What is claimed is:

1. An analog-to-digital converter comprising:
   a plurality of sections connected in a pipeline arrangement such that an earlier section receives analog signals and a later section, located downstream from the earlier section, receives analog residues of the analog signals after the earlier section has partially digitized the analog signals;
   wherein the earlier section comprises a first number of instances of an earlier stage, each of which receives one or more separate analog signals; and
   wherein the later section comprises a second number of instances of a later stage, which second number is less than the first number, wherein at least one instance of the later stage receives analog residues originating from a plurality of the instances of the earlier stage.

2. The analog-to-digital converter of claim 1, further comprising a multiplexer disposed between at least some instances of earlier stage and one or more instances of the later stage.

3. The analog-to-digital converter of claim 1, further comprising one or more additional sections connected in pipelined arrangement with the earlier and later sections.

4. The analog-to-digital converter of claim 3, wherein the stage instances in the pipelined sections together define a tree architecture.

5. The analog-to-digital converter of claim 1, wherein the separate unconverted analog signals are provided from lines carrying pixel outputs from a detector array.

6. An imager comprising:
   an array of detectors for providing analog output signals indicative of physical stimuli to which the one or more detectors has been exposed; and
   an analog-to-digital converter comprising
      a plurality of sections connected in a pipeline arrangement such that an first section receives analog output signals from the array of detectors and a later section, located downstream from the first section, receives analog residues of the analog output signals after the first section has partially digitized the analog output signals;
      wherein the first section comprises a first number of instances of a first stage each of which receives a separate analog output signal from a detector in the array; and
      wherein the later section comprises a second number of instances of a later stage, which second number is less than the first number, wherein at least one instance of the later stage receives analog residues originating from a plurality of the instances of the first stage.

7. The imager of claim 6, wherein the imager is CMOS imager.

8. The imager of claim 6, wherein the detectors are photodiodes.

9. The imager of claim 6, wherein the array and the analog-to-digital converter are provided on a single semiconductor substrate.

10. A system for producing an image of an object, the system comprising:
    (a) an imager comprising,
        (i) a plurality of pixels for providing analog output signals indicative of physical stimuli to which the pixels have been exposed; and
        (ii) an analog-to-digital converter comprising
            a plurality of sections connected in a pipeline arrangement such that an first section receives analog output signals from the array of detectors and a later section, located downstream from the first section, receives analog residues of the analog output signals after the first section has partially digitized the analog output signals;
            wherein the first section comprises a first number of instances of a first stage each of which receives a separate analog output signal from a detector in the array; and
            wherein the later section comprises a second number of instances of a later stage, which second number is less than the first number, wherein at least one instance of the later stage receives analog residues originating from a plurality of the instances of the first stage; and
    (b) means for outputting an image resulting from the outputs of the plurality of pixels.

11. The system of claim 10, wherein the image output by the means for outputting is a photograph.

12. The system of claim 10, wherein the means for outputting is a computer display device.

13. The system of claim 10, wherein the imager is a CMOS imager and each of the plurality of pixels comprise a photodiode diffusion formed in a well and a tap to power or ground also formed in the well.

14. An analog-to-digital conversion apparatus comprising:
    a plurality of first stages each of which receives separate analog signals and partially digitizes said separate analog signals; and
    a second stage located downstream from and connected in a pipeline arrangement with the plurality of first stages such that the second stage receives residues of the analog signals from each the plurality of first stages and further digitizes said residues.

15. The analog-to-digital conversion apparatus of claim 14, further comprising a multiplexer disposed between the plurality of first stages and the second stage.

16. The analog-to-digital conversion apparatus of claim 14, further comprising one or more additional stages connected in pipelined arrangement with the first and second stages.

17. The analog-to-digital converter of claim 16, wherein the stages in the pipelined arrangement together define a tree architecture.

18. The analog-to-digital converter of claim 14, further comprising lines coupled to the plurality of first stages and configured to carry the separate analog signals from pixel outputs of a detector array.

19. A method of digitizing analog signals from a plurality of sources, the method comprising:
    partially digitizing a plurality of separate analog signals at an early stage of a pipelined analog-to-digital converter;
    multiplexing a plurality of residues of the separate analog signals from the early stage such that said plurality of residues is provided to a later stage of the pipelined analog-to-digital converter; and
    further digitizing the multiplexed residues at the later stage.

20. The method of claim 19, wherein partially digitizing digitizes the most significant bit or bits of the separate analog signals.

21. The method of claim 19, wherein further digitizing digitizes the most significant bit or bits of the plurality of residues.

22. The method of claim 19, further comprising further digitizing a residue output by the later stage at a next later stage.

23. The method of claim 19, further comprising multiplexing a residue output by the later stage.

* * * * *